United States Patent [19]

Gore et al.

[11] Patent Number: 5,372,294

[45] Date of Patent: Dec. 13, 1994

[54] METHOD OF PREPARING A COMPONENT FOR AUTOMATED PLACEMENT

[75] Inventors: Kiron Gore, Coral Springs; Vahid Kazem-Goudarzi; Hai Teo, both of Surnise, all of Fla.

[73] Assignee: Motorola, Inc., Schaumburg, Ill.

[21] Appl. No.: 187,029

[22] Filed: Jan. 27, 1994

[51] Int. Cl.⁵ .......................... H05K 3/30; H05K 3/34
[52] U.S. Cl. .............................. 228/105; 228/180.22;
228/207; 29/833; 427/96
[58] Field of Search .................... 228/105, 175, 180.22,
228/207, 248.1, 254; 29/833; 427/96

[56] References Cited

U.S. PATENT DOCUMENTS 3,993,800 11/1976 Callender ............................ 427/74
5,043,296 8/1991 Hacke et al. ........................ 437/51
5,148,765 9/1992 Hung et al. ......................... 427/369
5,255,839 10/1993 da Costa Alves et al. ..... 228/180.21
5,257,714 11/1993 Beers et al. ........................ 228/105

FOREIGN PATENT DOCUMENTS 04330761 11/1992 Japan ................................... 228/105

Primary Examiner—Samuel M. Heinrich
Attorney, Agent, or Firm—Andrew S. Fuller

[57] ABSTRACT

A method of preparing a component for automated placement is provided. The method includes disposing tacking medium on a substantially transparent member (210); engaging the tacking medium with the component (230); and imaging the component through the substantially transparent member (240).

17 Claims, 2 Drawing Sheets

METHOD OF PREPARING A COMPONENT FOR AUTOMATED PLACEMENT

TECHNICAL FIELD

This invention relates in general to the preparation of a component for placement, and more particular, to the preparation of a component for placement by automated equipment utilizing an imaging system.

BACKGROUND

In the manufacture of electronic products, many manufacturing operations involve the assembly of discrete electrical and mechanical components to a support structure, in which these components are placed and soldered onto a circuit board. In a typical case, the circuit board is prepared by placing solder deposits at locations on the board at which components are to be mounted. Optionally, solder is placed directly on the components before the components are mounted. Component placement machines then select and properly orient components on the circuit board. Ordinarily, the components are temporarily secured to the circuit board by using a flux material, or other tacking medium. The solder is then reflowed to more permanently secure the components to the circuit board.

During assembly, components are retrieved from a component dispenser, oriented for placement, such as with the aid of an imaging system, or other alignment mechanism, and then placed on the circuit board. Oftentimes, the components are temporarily secured with tacking medium applied to the circuit board in a previous manufacturing process step. Alternatively, the tacking medium may be placed directly on the components. In either case, valuable manufacturing cycle time is consumed while the tacking medium is being applied. This cycle time must be added to other steps needed to place the components.

The reduction of manufacturing cycle time is an important goal of most manufacturing operations. This is especially true for high volume manufacturing involving the placement of several components to complete a product. Here, the extra time consumed by the component placement process has a substantial impact on overall production output. Hence, solutions which reduce manufacturing cycle time by reducing or eliminating steps are constantly in demand. Therefore, there exists a need to improve the cycle time required for component placement.

DETAILED DESCRIPTION OF THE PREFERRED EMBODIMENT

Generally, the invention provides for a method of preparing a component, such as an electrical or mechanical component, for automated placement, in order to achieve a reduction in process cycle time. The invention is applicable where a tacking medium is needed to secure the component to a support substrate, such as a circuit board, and where an imaging system is used to ensure proper orientation of the component on the circuit board. The invention accomplishes cycle time reduction by imaging the component during the application of the tacking medium. Specifically, the component is imaged through the tacking medium dispensing apparatus while the tacking medium is being applied to the component.

Figure 1:
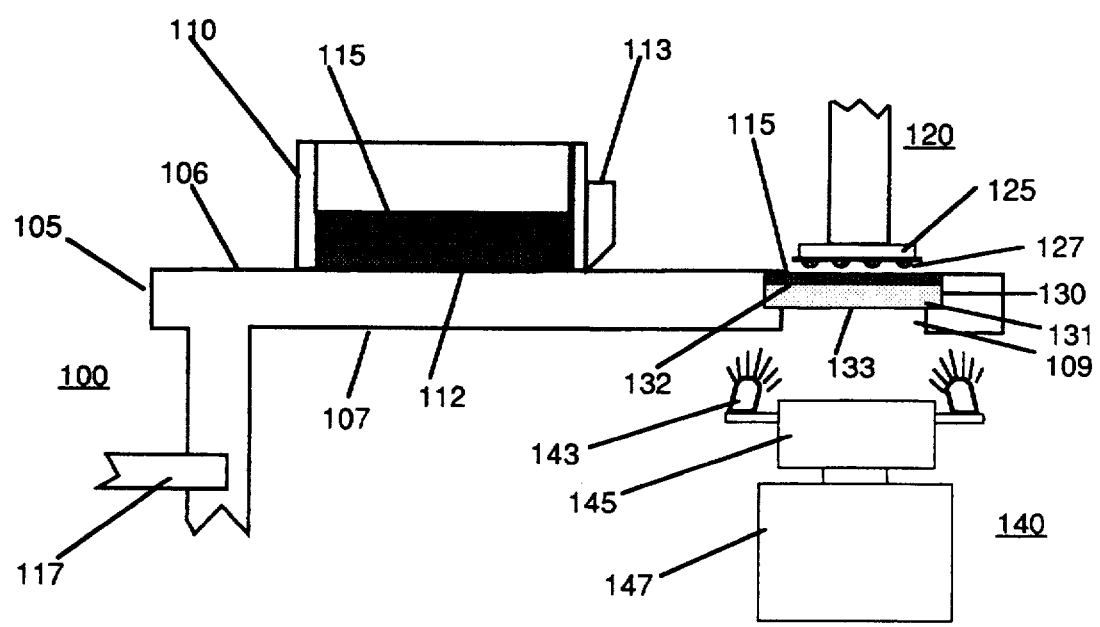
FIG. 1 shows a fragmentary view of an automated placement machine engaging an electronic component with a tacking medium dispensing apparatus and an associated vision imaging system, in accordance with the present invention.

Referring to FIG. 1, a fragmentary view of an automated placement machine 120 engaging an electronic component 125 with a tacking medium dispensing apparatus 100 and an associated vision imaging system 140 is shown, in accordance with the present invention. The electronic component 125 is a leadless pad array chip carrier such as described in U.S. Pat. No. 5,241,133, issued to Mullen, III et al. on Nov. 16, 1992, for a Leadless Pad Array Chip Carrier. The component 125 has an array of solder deposits 127 disposed thereon. The tacking medium dispensing apparatus 100 includes a main reservoir 110 containing tacking medium 115, a slider plate 105 slidably located under the main reservoir 110, and a dispensing reservoir 130 formed within the slider plate 105. In the preferred embodiment, solder flux is used as the tacking medium 115. The main reservoir 110 has a base portion 112 which has an opening (not shown) for dispensing the tacking medium 115. Ordinarily, the slider plate 105 is in an extended position such that the dispensing reservoir 130 is spaced apart from the main reservoir 110, as shown in FIG. 1. However, the slider plate 105 is retractable such that the dispensing reservoir 130 is located under the base portion 112 of the main reservoir 110. Movement of the slider plate 105 is controlled by an attached mechanical arm 117.

The dispensing reservoir 130 is formed from a cavity 109 extending through the slider plate 105 from a first surface 106 to a second surface 107. A transparent or substantially transparent member 131, such as optically fiat glass or plastic, is recessed within the cavity 109 to form a base for the dispensing reservoir 130. In the preferred embodiment, the slider plate 105 is approximately 6 millimeters in thickness and the transparent base 131 is recessed approximately 0.20–0.25 millimeters within the cavity 109. This configuration enables the dispensing reservoir 130 to hold a relatively thin layer of tacking medium 115. The automated placement machine 120 applies tacking medium 115 to the component 125 by immersing at least a portion of the component 125 in the dispensing reservoir 130. The dispensing reservoir 130 is replenished from the main reservoir 110 by retracting the slider plate 105 such that the dispensing reservoir 130 is adjacent to the opening within the base portion 112 of the main reservoir 110. After the dispensing reservoir 130 is filled, any excess tacking medium 115 is removed by a doctor blade 113 located on the side of the main reservoir 110, as the slider plate 105 is extended.

The transparent member 131 is a significant aspect of the present invention. A component 125 situated at or near the dispensing reservoir 130 along the first surface 106 of the slider plate 105 can be viewed from the second surface 107 for the slider plate 105 through the transparent member 131. Preferably, the tacking medium 115 is also transparent or substantially transparent to facilitate viewing of the component 125. The term "transparent" as used in reference to the transparent member 131 or the tacking medium 115 is satisfied if the respective material is substantially permeable to light. The imaging system 140 is used in combination with the dispensing reservoir 130 to provide information for the orientation of the component 125 for automated placement. A portion of the imaging system 140 is located adjacent to the transparent member 131 such that the component 125 can be viewed from the second surface 107 through the transparent member 131. In the preferred embodiment. The imaging system 140 comprises light sources 143, a camera 145, and analyzing equipment 147. The camera 145 and associated lighting, are located along the second surface 107 adjacent to the cavity 109, such that the camera 145 is aligned with the transparent member 131. Additionally, the light sources 143 and the camera 145 are directed toward the transparent member 131.

Figure 2:
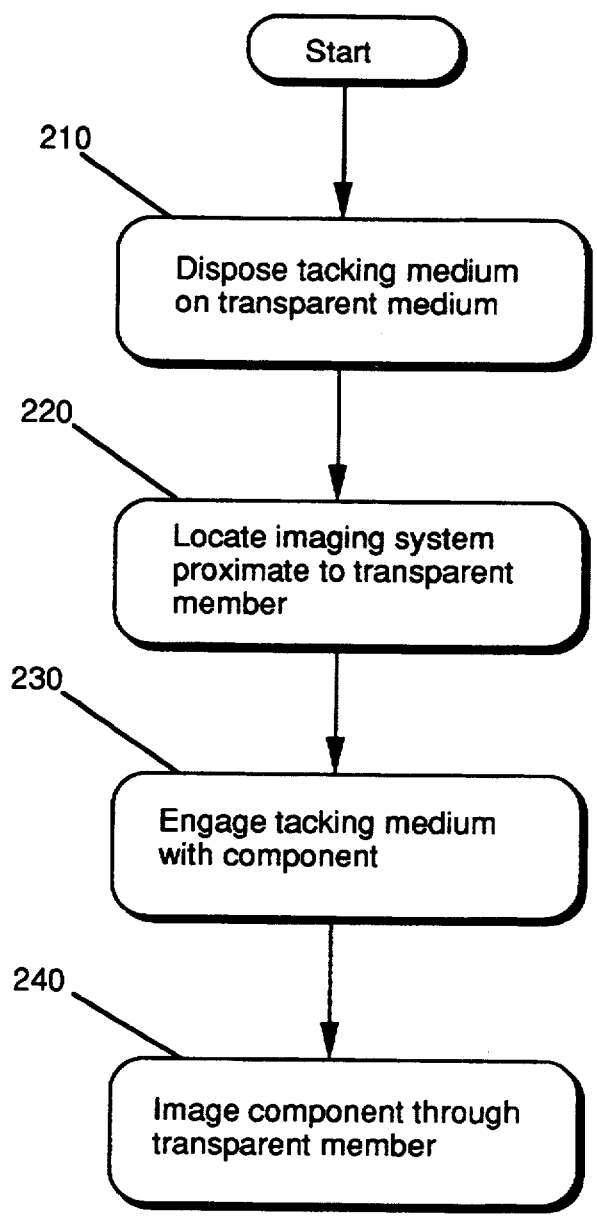
FIG. 2 is a flowchart summarizing the method steps for preparing a component for automated placement, in accordance with the present invention.

Referring to FIG. 2, the method of preparing a component 125 for automated placement is summarized, according to the present invention. First, a substantially transparent member 131 having tacking medium 115 disposed thereon is provided, step 210. In the preferred embodiment, the transparent member 131 has first and second opposing surfaces 133 and a substantially even layer of transparent flux 115 is disposed on the first opposing surface 132. The tacking medium dispensing apparatus 100 described above provides and maintains an even layer of tacking medium 115. At least a portion of the imaging system 140 is located proximate to the transparent member 131 to facilitate imaging of the component 125, step 220. Next, the automated placement machine 120 is used to engage the component 125 with the tacking medium 115 on the transparent member 131 by immersing at least a portion of the component 125 in the tacking medium 115, step 230. In the preferred embodiment, the component 125 is immersed such that the array of solder deposits 127 engages the tacking medium 115. The component 125 is imaged through the transparent member 131, step 240. In the preferred embodiment the camera 145 is positioned proximate to the second opposing surface 133 of the transparent member 131, and imaging is performed accordingly. Preferably imaging occurs during the process step of engaging the tacking medium 115 with the component 125. The component 125 is imaged while the component 125 is engaging the tacking medium 115. Alternatively, the component 125 is first removed from the tacking medium 115 and the imaging system 140 images an imprint of the component 125 on the transparent member 131. The component image or imprint is then analyzed to determine component position and orientation. The component image or imprint, may also be analyzed to determine missing elements of the component 125. For example, the lack of a specific portion of an imprint may signify that elements of the component, such as solder deposits or other subparts, were missing. Preferably, the dispensing apparatus described above is used to replenish the layer of tacking medium 115 on the transparent member 131 after each engagement of the tacking medium 115 with the component 125.

The present invention offers a significant reduction in process cycle time in manufacturing operations in which a component 125 requires flux 115 or other tacking media, and also requires the use of an imaging system 140 to assist in component placement. In prior art operations, these process operations are performed independently, and manufacturing cycle time is consumed as each component 125 is moved to a different location for these operations. By imaging the component 125 during the application of the tacking medium 115, the additional time required for imaging the component 125, over and above the time required for the application of tacking medium 115, is minimized. Thus, the overall manufacturing cycle time is reduced. Hence, using the novel tacking medium dispensing apparatus 100 in combination with an imaging system 140, a reduction in manufacturing cycle time is achieved for component placement.

We claim:

1. A method of preparing a component for automated placement, the method comprising the steps of:
   disposing tacking medium on a substantially transparent member;
   engaging the tacking medium with the component; and
   imaging the component through the substantially transparent member.

2. The method of claim 1, wherein the step of disposing tacking medium on a substantially transparent member comprises the step of:
   disposing tacking medium on a first surface of the substantially transparent member.

3. The method of claim 2, wherein the step of imaging the component through the substantially transparent member comprises the step of:
   imaging the component from a position proximate to a second surface of the substantially transparent member which opposes the first surface.

4. The method of claim 1, wherein the step of disposing tacking medium on a substantially transparent member comprises the step of:
   disposing a substantially transparent tacking medium.

5. The method of claim 1, wherein the step of disposing tacking medium on a substantially transparent member comprises the step of:
   disposing a substantially even layer of tacking medium on the substantially transparent member.

6. The method of claim 1, wherein the step of imaging the component through the substantially transparent member comprises the step of:
   imaging the component while the component is engaging the tacking medium.

7. The method of claim 1, further comprising the step of:
   replenishing the tacking medium on the substantially transparent member after engaging the tacking medium with the component.

8. A method of preparing a component for automated placement, the method comprising the steps of:
   disposing tacking medium on a substantially transparent member;
   immersing at least a portion of the component in the tacking medium;
   removing the component from the tacking medium; and
   imaging an imprint of the component on the substantially transparent member through the substantially transparent member.

9. The method of claim 8, wherein the step of imaging an imprint of the component on the substantially transparent member through the substantially transparent member comprises the step of:
   analyzing the imprint of the component on the substantially transparent member to determine component orientation.

10. The method of claim 8, wherein the step of imaging an imprint of the component on the substantially transparent member through the substantially transparent member comprises the step of:
   analyzing the imprint of the component to determine missing elements.

11. A method of preparing a component for automated placement, the method comprising the steps of:
   providing a substantially transparent member having tacking medium disposed thereon;
   locating at least a portion of an imaging system proximate to the substantially transparent member;
   engaging the tacking medium with the component; and
   imaging the component through the substantially transparent member.

12. The method of claim 11, wherein the step of providing a substantially transparent member having tacking medium disposed thereon comprises the steps of:
   providing a substantially transparent member having first and second opposing surfaces; and
   disposing tacking medium on the first opposing surface.

13. The method of claim 12, wherein the step of locating at least a portion of an imaging system proximate to the substantially transparent member comprises the step of:
   locating a portion of the imaging system proximate to the second opposing surface of the substantially transparent member.

14. The method of claim 13, wherein the step of locating a portion of the imaging system proximate to the second opposing surface of the substantially transparent member comprises the step of:
   positioning a camera proximate to the second opposing surface.

15. The method of claim 11, wherein the step of providing a substantially transparent member having tacking medium disposed thereon comprises the step of:
   disposing a substantially even layer of tacking medium on the substantially transparent member.

16. The method of claim 11, further comprising the step of:
   replenishing the tacking medium on the substantially transparent member after engaging the tacking medium with the component.

17. A method of preparing an electronic component for automated placement, the electronic component having an array of solder deposits disposed thereon, the method comprising the steps of:
   disposing flux on a substantially transparent member;
   immersing at least a portion of the component in the flux such that the array of solder deposits engages the flux; and
   imaging the component through the substantially transparent member.

* * * * *